(12) United States Patent
Lin et al.

(10) Patent No.: US 7,893,475 B2
(45) Date of Patent: Feb. 22, 2011

(54) DYNAMIC RANDOM ACCESS MEMORY CELL AND MANUFACTURING METHOD THEREOF

(75) Inventors: Ta-Wei Lin, Chiayi County (TW); Wen-Jer Tsai, Hualien County (TW)

(73) Assignee: Macronix International Co., Ltd., Hsinchu (TW)

( * ) Notice: Subject to any disclaimer, the term of this patent is extended or adjusted under 35 U.S.C. 154(b) by 395 days.

(21) Appl. No.: 11/626,444

(22) Filed: Jan. 24, 2007

(65) Prior Publication Data
US 2008/0173896 A1    Jul. 24, 2008

(51) Int. Cl.
*H01L 29/78*    (2006.01)
*H01L 21/336*    (2006.01)

(52) U.S. Cl. ............... 257/296; 257/288; 257/E27.084; 257/E21.646

(58) Field of Classification Search .................. 257/296, 257/E27.084, E21.646
See application file for complete search history.

(56) References Cited

U.S. PATENT DOCUMENTS

| | | | |
|---|---|---|---|
| 5,019,882 A * | 5/1991 | Solomon et al. ............. 257/409 |
| 6,004,137 A * | 12/1999 | Crabbe et al. ................ 438/158 |
| 6,246,077 B1 * | 6/2001 | Kobayashi et al. ............ 257/77 |
| 6,744,104 B1 * | 6/2004 | Aoki et al. ................... 257/372 |
| 6,917,096 B2 * | 7/2005 | Sugiyama et al. ........... 257/616 |
| 7,042,052 B2 * | 5/2006 | Bhattacharyya ............. 257/347 |
| 7,238,555 B2 * | 7/2007 | Orlowski et al. ............. 438/151 |
| 7,517,741 B2 * | 4/2009 | Orlowski et al. ............. 438/151 |
| 2004/0124488 A1 * | 7/2004 | Fazan et al. .................. 257/437 |

* cited by examiner

*Primary Examiner*—Leonardo Andújar
*Assistant Examiner*—William Harriston
(74) *Attorney, Agent, or Firm*—Thomas, Kayden, Horstemeyer & Risley

(57) ABSTRACT

A dynamic random access memory cell including a bottom oxide layer, a first semiconductor layer, a second semiconductor layer, an insulation layer, a gate and a doping layer is provided. The bottom oxide layer is disposed on a substrate. The first semiconductor layer disposed on the bottom oxide layer has a first doping concentration. The second semiconductor layer disposed on the first semiconductor layer has a second doping concentration lower than the first doping concentration. The insulation layer disposed on the bottom oxide layer at least situates at the two sides of the first semiconductor layer. The height of the insulation layer is greater than that of the first semiconductor layer. The gate is disposed on the second semiconductor layer. The doping layer disposed correspondingly to the two sides of the gate substantially contacts the second semiconductor layer and the insulation layer.

21 Claims, 5 Drawing Sheets

DYNAMIC RANDOM ACCESS MEMORY CELL AND MANUFACTURING METHOD THEREOF

BACKGROUND OF THE INVENTION

1. Field of the Invention

The invention relates in general to a memory cell and a manufacturing method thereof, and more particularly to a one-transistor dynamic random access memory cell and a manufacturing method thereof.

2. Description of the Related Art

Recently, dynamic random access memories (DRAM) are widely applied to personal computers and all kinds of accessories, such as graphic cards, scanners, printers, fax machines and video compression cards. In addition to the conventional dynamic random access memory (1T1C-DRAM) including a transistor and a capacitor, a one-transistor dynamic random access memory (1T-DRAM) is developed recently. A floating body is used for storing carriers in order to store data. By simplifying the structure of the memory, the storage density per unit area is increased, and the manufacturing process is simplified as well. Furthermore, because the one-transistor dynamic random access memory reads data in a non-destructive way, the service life of the memory is prolonged. Therefore, the one-transistor dynamic random access memory has great potential and becomes one of the most important research directions nowadays.

Generally speaking, memory cells are formed on a silicon-on-insulator wafer (SOI wafer) in the one-transistor dynamic random access memory for separating the floating body in a semiconductor layer among a source region, a drain region, a bottom oxide layer and a gate oxide layer to store the carriers. However, as the manufacturing process of the memories progresses, the size of the memory device becomes smaller. The length of the channel between the source region and the drain region in the cell is shortened. When the length of the channel is shortened to a certain level, short channel effects, like low threshold voltage, punch through effect and drain induced barrier lowering (DIBL), can occur. As a result, the stability of memory operation is affected seriously. Moreover, because the carriers leak out from the junctions between the semiconductor layer, the drain and the source, the retention time of the carrier can not be increased. Therefore, the product quality can not be further improved.

SUMMARY OF THE INVENTION

The invention is directed to a dynamic random access memory cell and a manufacturing method thereof. The energy levels of the doping layer, the first semiconductor layer and the second semiconductor layer are arranged, so that a carrier is stored in a first semiconductor layer adjacent to a bottom oxide layer. Therefore, the carrier is kept away from the junction between the semiconductor layer and a drain, and the junction between the semiconductor layer and a source to avoid the leakage of the carrier. As a result, the retention time of the memory cell is increased, and the volume of the memory is reduced. The electricity consumption is lowered, and the product property is improved.

According to the present invention, a dynamic random access memory cell including a bottom oxide layer, a first semiconductor layer, a second semiconductor layer, an insulation layer, a gate and a doping layer is provided. The bottom oxide layer is disposed on a substrate. The first semiconductor layer disposed on the bottom oxide layer has a first doping concentration. The second semiconductor layer disposed on the first semiconductor layer has a second doping concentration lower than the first doping concentration. The insulation layer disposed on the bottom oxide layer at least is located at the two sides of the first semiconductor layer. The height of the insulation layer is greater than that of the first semiconductor layer. The gate is disposed on the second semiconductor layer. The doping layer disposed correspondingly to the two sides of the gate substantially contacts the second semiconductor layer and the insulation layer.

According to the present invention, a manufacturing method of a dynamic random access memory cell is provided. First, a bottom oxide layer is formed on a substrate. Next, a first semiconductor layer is formed on the bottom oxide layer, and a second semiconductor layer is formed on the first semiconductor layer. Afterwards, an electrode stack structure is formed on the second semiconductor layer. Subsequently, the electrode stack structure, the second semiconductor layer and the first semiconductor layer are patterned. Afterwards, an insulation layer is formed at two sides of the first semiconductor layer. The insulation layer contacts at least part of the two sides of the second semiconductor layer. The height of the insulation layer is greater than that of the first semiconductor layer. Thereon, a doping layer is formed on at least part of the two sides of the second semiconductor layer. A top surface of the doping layer and a top surface of the second semiconductor layer are in the same horizontal plane.

According to the present invention, another manufacturing method of a dynamic random access memory cell is provided. First, a bottom oxide is formed on a substrate. Next, a first semiconductor layer is formed on the bottom oxide layer, and a second semiconductor layer is formed on the first semiconductor layer. Then, an electrode stack structure is formed on the second semiconductor layer. Afterwards, the electrode stack structure, the second semiconductor layer and the first semiconductor layer are patterned. Subsequently, an insulation layer is formed at two sides of the first semiconductor layer and the second semiconductor layer. The height of the insulation layer is greater than that of the first semiconductor layer. After, a doping layer is formed on the insulation layer.

According to the present invention, another manufacturing method of a dynamic random access memory cell is provided. First, a bottom oxide layer is formed on a substrate. Next, a first semiconductor layer is formed on the bottom oxide layer, and a second semiconductor layer is formed on the first semiconductor layer. Then, an electrode stack structure is formed on the second semiconductor layer. Afterwards, the electrode stack structure, the second semiconductor layer and the first semiconductor layer are patterned. Subsequently, an insulation layer is formed at two sides of the first semiconductor layer, the second semiconductor layer and the electrode stack structure. After, the electrode stack structure is patterned again. Thereon, a doping layer is formed on the second semiconductor layer. The doping layer is located between two sides of the electrode stack structure and the insulation layer.

The invention will become apparent from the following detailed description of the preferred but non-limiting embodiments. The following description is made with reference to the accompanying drawings.

DETAILED DESCRIPTION OF THE INVENTION

Two embodiments are provided as follow to illustrate the present invention. These two embodiments are different in the arrangement of the doping layer. However, the invention is not limited thereto. Also, the invention is not limited to the embodiments described herein. Unnecessary components are not shown in drawings for clarity.

First Embodiment

Figure 1A:
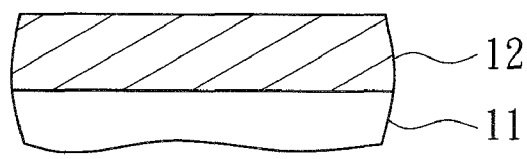
FIG. 1A illustrates a bottom oxide layer formed on a substrate according to a first embodiment of the invention.
Figure 1B:
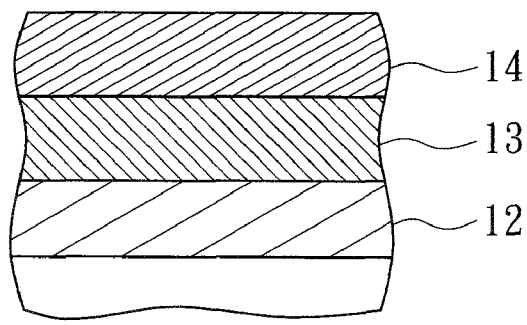
FIG. 1B illustrates a first semiconductor layer and a second semiconductor layer formed on the bottom oxide layer in FIG. 1A.
Figure 1C:
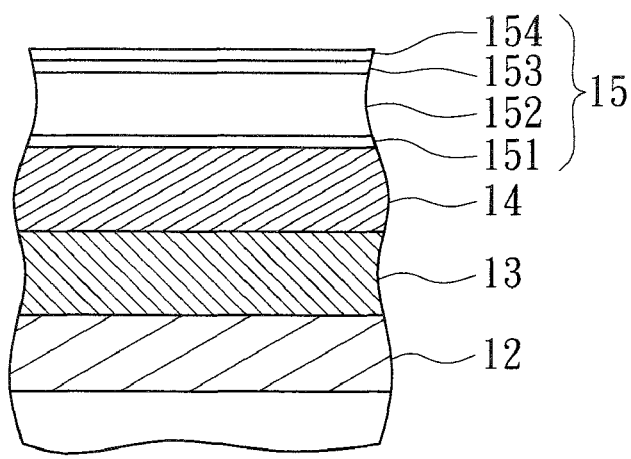
FIG. 1C illustrates an electrode stack structure formed on the second semiconductor layer in FIG. 1B.
Figure 1D:
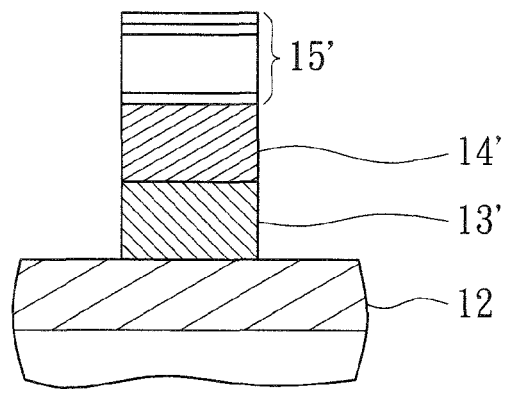
FIG. 1D illustrates the electrode stack structure, the second semiconductor layer and the first semiconductor layer in FIG. 1C after patterning.
Figure 1E:
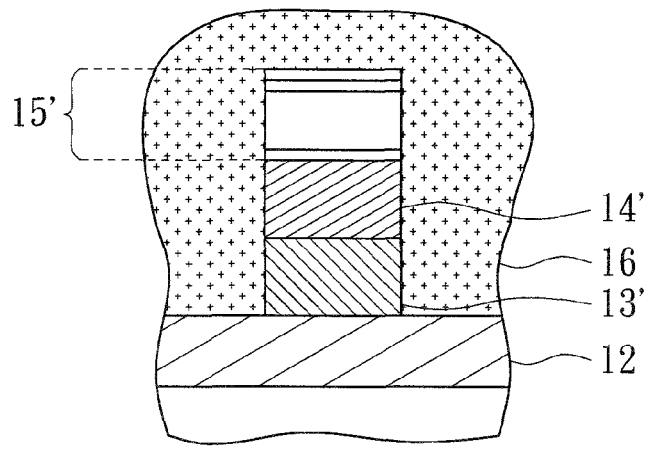
FIG. 1E illustrates an oxide layer deposited on the bottom oxide layer in FIG. 1D.
Figure 1F:
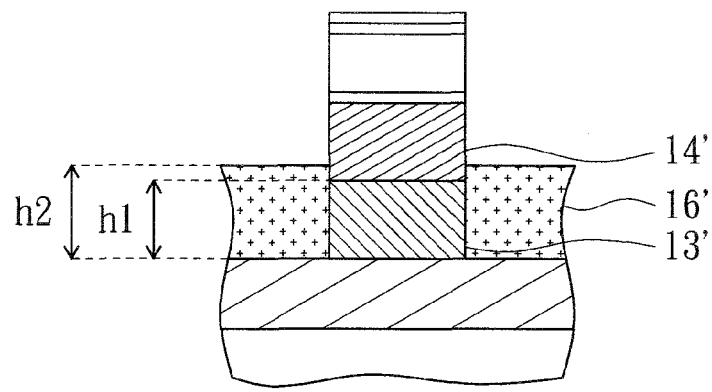
FIG. 1F illustrates the oxide layer in FIG. 1E after etching.
Figure 1G:
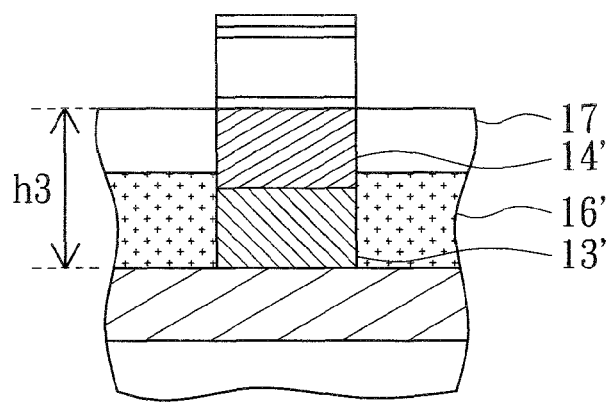
FIG. 1G illustrates a silicon layer grown by epitaxy on the insulation layer in FIG. 1F.
Figure 1H:
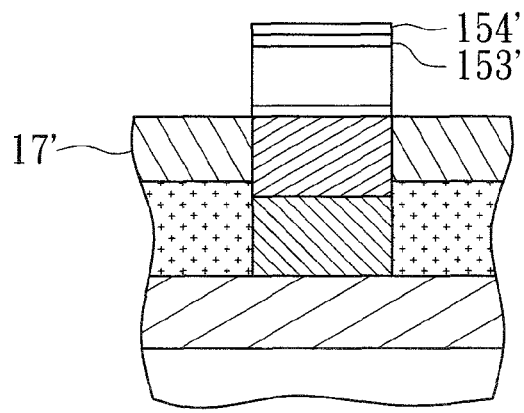
FIG. 1H illustrates the silicon layer after dopants are doped in the silicon layer in FIG. 1G.
Figure 2:
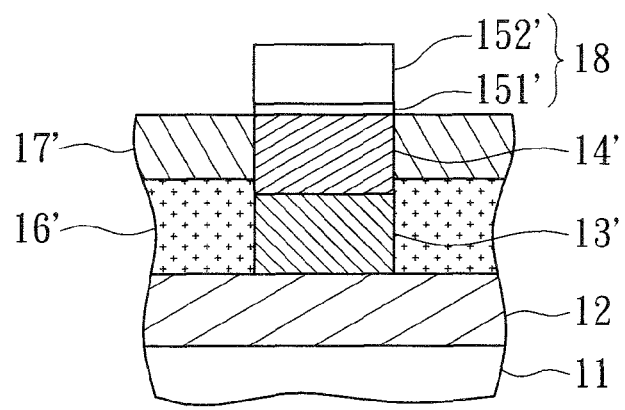
FIG. 2 illustrates a dynamic random access memory cell according to the first embodiment of the invention.

Please refer to FIGS. 1A~1H at the same time. FIG. 1A illustrates a bottom oxide layer formed on a substrate according to a first embodiment of the invention. FIG. 1B illustrates a first semiconductor layer and a second semiconductor layer formed on the bottom oxide layer in FIG. 1A. FIG. 1C illustrates an electrode stack structure formed on the second semiconductor layer in FIG. 1B. FIG. 1D illustrates the electrode stack structure, the second semiconductor layer and the first semiconductor layer in FIG. 1C after patterning. FIG. 1E illustrates an oxide layer deposited on the bottom oxide layer in FIG. 1D. FIG. 1F illustrates the oxide layer in FIG. 1E after etching. FIG. 1G illustrates a silicon layer grown by epitaxy on the insulation layer in FIG. 1F. FIG. 1H illustrates the silicon layer after dopants are doped in the silicon layer in FIG. 1G.

A manufacturing method according to the present embodiment includes following steps. First, a bottom oxide layer 12 is formed on a substrate 11, as shown in FIG. 1A.

Next, as shown in FIG. 1B, a first semiconductor layer 13 is formed on the bottom oxide layer 12, and a second semiconductor layer 14 is formed on the first semiconductor layer 13.

Then, as shown in FIG. 1C, an electrode stack structure 15 is formed on the second semiconductor layer 14. The electrode stack structure 15 is formed by successive steps for example. First, an electrode oxide layer 151 is formed on the second semiconductor layer 14. Next, an electrode layer 152 is formed on the electrode oxide layer 151. Then, a buffer layer 153 is formed on the electrode layer 152. Afterwards, a mask layer 154 is formed on the buffer layer 153.

Subsequently, the electrode stack layer 15, the second semiconductor layer 14 and the first semiconductor layer 13 are patterned, as shown in FIG. 1D.

Thereon, an insulation layer is formed at two sides of the first semiconductor layer 13. In the present embodiment, the insulation layer is formed by following steps. First, as shown in FIG. 1E, an oxide layer 16 is formed on the bottom oxide layer 12. The oxide layer 16 covers the bottom oxide layer 12, the patterned first semiconductor layer 13', the patterned second semiconductor layer 14' and the patterned electrode stack structure 15'. Next, the oxide layer 16 is etched, so that the height h2 of the oxide layer 16 is greater than the height h1 of the first semiconductor layer 13. The oxide layer 16 contacts at least part of the two sides of the second semiconductor layer 14', as shown in FIG. 1F. The etched oxide layer 16 forms the insulation layer 16'.

Afterwards, a doping layer is formed on the insulation layer 16'. The doping layer is formed by following steps. First, as shown in FIG. 1G, a silicon layer 17 is grown by epitaxy on the insulation layer 16'. The total height h3 of the insulation layer 16' and the silicon layer 17 is substantially the same as the total height of the first semiconductor layer 13' and the second semiconductor layer 14'. Next, dopants are doped into the silicon layer 17. As shown in FIG. 1H, the doping layer 17' is formed by the doped silicon layer 17 to be a source and a drain.

In the present embodiment, the memory cell 100 is exemplified by an n-type channel semiconductor. The first semiconductor layer 13' has a first doping concentration, and the second semiconductor layer 14' has a second doping concentration. The first doping concentration is higher than the second doping concentration. Also, the materials of the first semiconductor layer 13' and the second semiconductor layer 14' have the same lattice structure. Furthermore, the first semiconductor layer 13' is made of p-type doped silicon germanium (SiGe), and the second semiconductor layer 14' is made of p-type doped silicon for example. The doping layer 17' is made of n-type doped silicon for example. In other words, the energy level of the first semiconductor layer 13' is higher than that of the second semiconductor layer 14', and the energy level of the second semiconductor layer 14' is higher than that of the doping layer 17'. Therefore, when the carrier (hole) is stored in the memory cell 100, the carrier tends to move toward the first semiconductor layer 13' with high energy level. As a result, the carrier is kept away from the junction between the second semiconductor layer 14' and the doping layer 17'. Also, the insulation layer 16' disposed at two sides of the first semiconductor layer 13' prevents the carrier from leaking. As a result, the retention time of the memory cell 100 is increased, and the characteristic of the memory cell 100 for storing data is improved. Furthermore, by prolonging the retention time of the cell 100, the refresh time of the dynamic random access memory is shortened. Generally speaking, the electricity consumption of the memory is lowered.

However, anyone who has ordinary skill in the field of the invention can understand that the invention is not limited thereto. The memory cell 100 can be a p-type channel semiconductor. For example, the first semiconductor layer 13' is made of n-type doped silicon, and the second semiconductor layer 14' is made of n-type doped silicon germanium. Also, the doping layer 17' is made of p-type doped silicon germanium for instance. In other words, the energy level of the first semiconductor layer 13' is lower than that of the second semiconductor layer 14'. The energy level of the second semiconductor layer 14' is lower than that of the doping layer 17'. Therefore, when the carrier (electron) is stored in the memory cell 100, the carrier tends to move toward the first semiconductor layer 13' with low energy level. As a result, the carrier is kept away from the junction between the second semiconductor layer 14' and the doping layer 17'.

However, anyone who has ordinary skill in the field of the invention can understand that the invention is not limited thereto. The memory cell 100 can be a p-type channel semiconductor. For example, the first semiconductor layer 13' is made of n-type doped poly-silicon, and the second semiconductor layer 14' is made of n-type doped silicon germanium. Also, the electrode layer 152' and the doping layer 17' are made of p-type doped silicon germanium for instance. In other words, the energy level of the first semiconductor layer 13' is lower than that of the second semiconductor layer 14'. The energy level of the second semiconductor layer 14' is lower than that of the doping layer 17'. Therefore, when the carrier (electron) is stored in the memory cell 100, the carrier tends to move toward the first semiconductor layer 13' with low energy level. As a result, the carrier is kept away from the junction between the second semiconductor layer 14' and the doping layer 17'.

Second Embodiment

The memory cell of the present embodiment and the memory cell 100 of the first embodiment are different in the arrangement of the insulation layer. The same parts are not described repeatedly in the present embodiment. A manufacturing method of the present embodiment includes following steps. First, a bottom oxide layer, a first semiconductor layer, a second semiconductor layer and a electrode stack structure are formed on the substrate orderly. The forming steps are the same as those in the first embodiments and not described again.

Figure 3A:
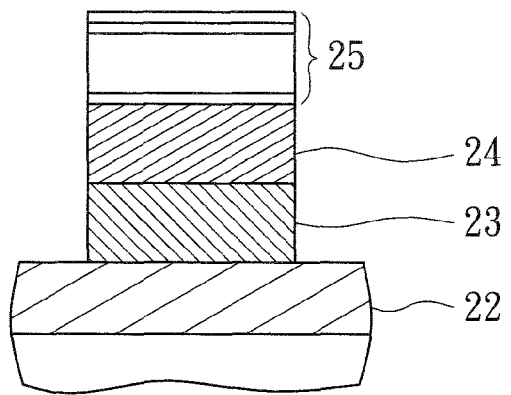
FIG. 3A illustrates an electrode stack structure, a first semiconductor layer and a second semiconductor layer according to a second embodiment of the invention after patterning.
Figure 3B:
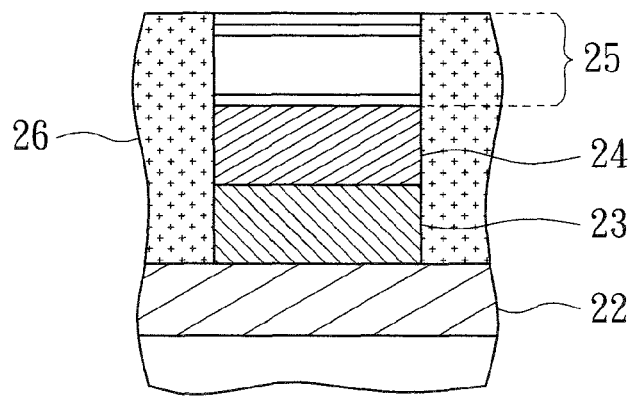
FIG. 3B illustrates an insulation layer formed at two sides of the first semiconductor layer, the second semiconductor layer and the electrode stack structure in FIG. 3A.
Figure 3C:
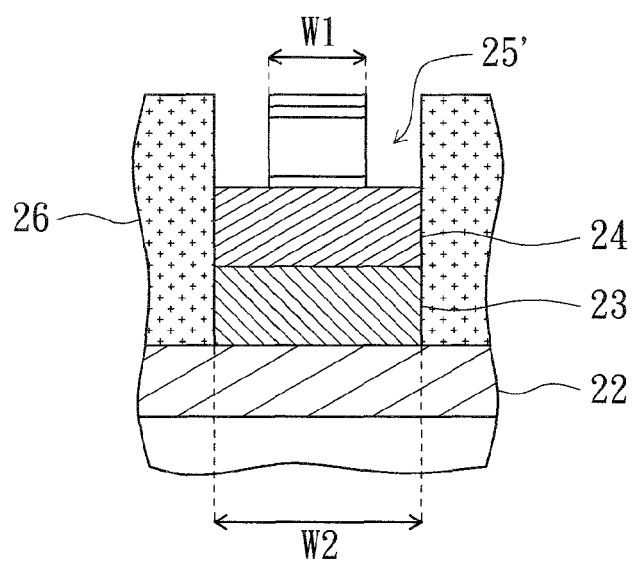
FIG. 3C illustrates the electrode stack layer in FIG. 3B after patterning.
Figure 3D:
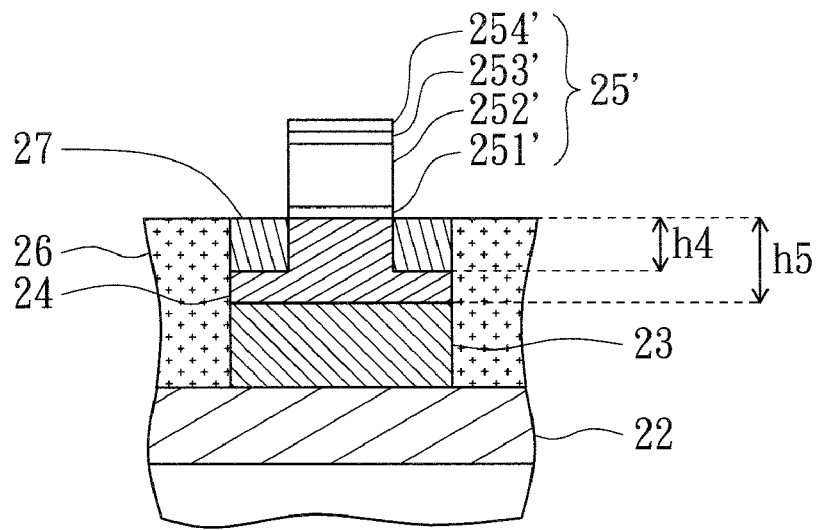
FIG. 3D illustrates a doping layer formed on the second semiconductor layer in FIG. 3C.

Please refer to FIGS. 3A~3D. FIG. 3A illustrates an electrode stack structure, the first semiconductor layer and the second semiconductor layer according to the second embodiment of the invention after patterning. FIG. 3B illustrates an insulation layer formed at two sides of the first semiconductor layer, the second semiconductor layer and the electrode stack structure in FIG. 3A. FIG. 3C illustrates the electrode stack structure in FIG. 3B after patterning. FIG. 3D illustrates a doping layer formed on the second semiconductor layer in FIG. 3C.

The manufacturing method of the present embodiment proceeds to the step of patterning the electrode stack structure 25, the second semiconductor layer 24 and the first semiconductor layer 23, as shown in FIG. 3A.

Next, an insulation layer 26 is formed at two sides of the first semiconductor layer 23, the second semiconductor layer 24 and the electrode stack structure 25, as shown in FIG. 3B. In the present embodiment, the insulation layer 26 is formed by successive steps for example. An oxide layer is deposited on the bottom oxide layer 22. Then, a top surface of the oxide layer and the electrode stack structure 25 is planarized. The oxide layer forms the insulation layer 26.

Afterwards, the electrode stack structure 25 is patterned again. The width w1 of the patterned electrode structure 25' is less than that of the width w2 of the first semiconductor layer 23 and the second semiconductor layer 24, as shown in FIG. 3C.

Subsequently, a doping layer 27 is formed on the second semiconductor layer 24. As shown in FIG. 3D, the doping layer 27 is located between two sides of the electrode stack structure 25' and the insulation layer 26. The doping layer 27 is formed by successive steps for example. Dopants are doped in the second semiconductor layer 24 by ion implantation. The height h4 of the dopants is less than the height h5 of the second semiconductor layer 24.

Figure 4:
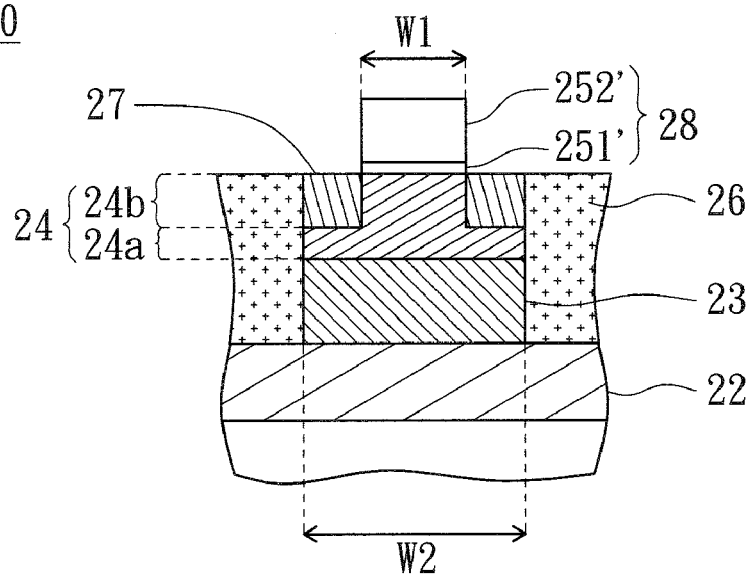
FIG. 4 illustrates the dynamic random access memory cell according to the second embodiment of the invention.

Thereon, the mask layer 254' and the buffer layer 253' in the electrode stack structure 25 are removed. After that, a gate 28 is formed by the electrode layer 252' and the electrode oxide layer 251'. Then, the insulation layer 26 and the doping layer 27 are planarized. The dynamic random access memory cell according to the second embodiment of the invention is formed completely in this step. Please referring to FIG. 4, the dynamic random access memory cell according to the second embodiment of the invention is illustrated in FIG. 4. The memory cell 200 includes the bottom oxide layer 22, the first semiconductor layer 23, the second semiconductor layer 24, the insulation layer 26, the gate 28 and the doping layer 27.

The second semiconductor 24 includes a first part 24a and a second part 24b. The first part 24a is located on the first semiconductor layer 23. The width of the first part 24a is substantially the same as the width w2 of the first semiconductor layer 23 and the second semiconductor layer 24. The second part 24b is located on the first part 24a. The width of the second part 24b is substantially the same as the width w1 of the gate 28. The doping layer 27 is located on the first part 24a and at two sides of the second part 24b. The insulation layer 26 is located at two sides of the first semiconductor layer 23, the second semiconductor layer 24 and the doping layer 27.

The dynamic random access memory cell includes the bottom oxide layer, the first semiconductor layer, the second semiconductor layer, the insulation layer, the gate and the doping layer. The first semiconductor layer is disposed on the bottom oxide layer and has the first doping concentration. The second semiconductor layer is disposed on the first semiconductor layer and has the second doping concentration. The first doping concentration is higher than the second doping concentration. The energy levels of the doping layer, the second semiconductor layer and the first semiconductor layer increase progressively or decrease progressively. As a result, the carrier (hole or electron) is stored in the first semiconductor layer and kept away from the junction between the second semiconductor layer and the doping layer. Furthermore, the insulation layer is disposed at two sides of the first semiconductor layer, so the leakage of the carrier in the cell is reduced, and the retention time is increased accordingly. Moreover, the memory cell according to the embodiments of the invention avoids the short channel effect. As a result, the volume of the memory cell can be further reduced. Besides, the refreshing time of the memory is decreased in the memory cell according to the embodiments of the invention, and the electricity consumption of the memory is lowered as well.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory cell comprising:
a bottom oxide layer disposed on a substrate;
a first semiconductor layer disposed on the bottom oxide layer;
a second semiconductor layer disposed on the first semiconductor layer;

an insulation layer disposed on the bottom oxide layer and located on at least two sides of the first semiconductor layer, the height of the insulation layer greater than the height of the first semiconductor layer;

a gate disposed on the second semiconductor layer; and a doping layer disposed above the insulation layer and correspondingly to two sides of the gate, the doping layer electrically coupled to the second semiconductor layer, wherein a top surface of the doping layer and a top surface of the second semiconductor layer are substantially in the same horizontal plane;

wherein the gate, the second semiconductor layer and the first semiconductor layer have the same width.

2. The memory cell according to claim 1, wherein the materials of the first semiconductor layer and the second semiconductor layer have the same lattice structure.

3. The memory cell according to claim 1, wherein the doping layer is disposed on the insulation layer and located at two sides of the second semiconductor layer.

4. The memory cell according to claim 3, wherein the total height of the insulation layer and the doping layer is substantially the same as the total height of the first semiconductor layer and the second semiconductor layer.

5. The memory cell according to claim 1, wherein the insulation layer is located at two sides of the second semiconductor layer.

6. The memory cell according to claim 1, wherein the gate comprises:

an electrode oxide layer disposed on the second semiconductor layer; and an electrode layer disposed on the electrode oxide layer.

7. The memory cell according to claim 6, wherein the electrode layer and the doping layer are n-type doped, and the first semiconductor layer and the second semiconductor layer are p-type doped.

8. The memory cell according to claim 7, wherein the energy level of the first semiconductor layer is higher than the energy level of the second semiconductor layer.

9. The memory cell according to claim 8, wherein the first semiconductor layer is made of p-type doped silicon germanium (SiGe), the second semiconductor layer made of p-type doped poly-silicon, the doping layer made of n-type doped poly-silicon.

10. The memory cell according to claim 6, wherein the electrode layer and the doping layer are p-type doped, the first semiconductor layer and the second semiconductor layer being n-type doped.

11. The memory cell according to claim 10, wherein the energy level of the first semiconductor layer is lower than the energy level of the second semiconductor layer.

12. The memory cell according to claim 11, wherein the first semiconductor layer is made of n-type doped poly-silicon, the second semiconductor layer made of n-type doped silicon germanium, the doping layer made of p-type doped silicon germanium.

13. The memory cell according to claim 1, wherein the first semiconductor has a first doping concentration and the second semiconductor has a second doping concentration lower than the first doping concentration.

14. The memory cell according to claim 1, wherein the doping layer contacts an upper surface of the insulation layer.

15. A memory cell comprising:

a bottom oxide layer disposed on a substrate;

a first semiconductor layer disposed on the bottom oxide layer;

a second semiconductor layer disposed on the first semiconductor layer;

an insulation layer disposed on the bottom oxide layer and located on at least two sides of the first semiconductor layer;

a gate disposed on the second semiconductor layer; and a doping layer disposed above the insulation layer and correspondingly to two sides of the gate, the doping layer electrically coupled to the second semiconductor layer, wherein the doping layer is disposed apart from the first semiconductor layer.

16. The memory cell according to claim 15, wherein the first semiconductor has a first doping concentration and the second semiconductor has a second doping concentration lower than the first doping concentration.

17. The memory cell according to claim 15, wherein the height of the insulation layer is greater than the height of the first semiconductor layer.

18. The memory cell according to claim 15, wherein the materials of the first semiconductor layer and the second semiconductor layer have the same lattice structure.

19. The memory cell according to claim 15, wherein the gate, the second semiconductor layer and the first semiconductor layer have the same width.

20. The memory cell according to claim 15, wherein the insulation layer contacts the two sides of the first semiconductor layer.

21. The memory cell according to claim 15, wherein the doping layer contacts an upper surface of the insulation layer.

* * * * *